(12) United States Patent
Wang (10) Patent No.: US 11,600,320 B2
(45) Date of Patent: Mar. 7, 2023

(54) PERPECTUAL DIGITAL PERCEPTRON

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 585 days.

(21) Appl. No.: 16/717,444

(22) Filed: Dec. 17, 2019

(65) Prior Publication Data

US 2021/0183437 A1 Jun. 17, 2021

(51) Int. Cl.
| | | |
|---|---|---|
| G11C 8/08 | (2006.01) | |
| G11C 15/04 | (2006.01) | |
| G06N 3/063 | (2006.01) | |
| G06N 3/08 | (2006.01) | |
| G11C 11/54 | (2006.01) | |

(52) U.S. Cl.
CPC .............. *G11C 11/54* (2013.01); *G06N 3/063* (2013.01); *G06N 3/08* (2013.01); *G11C 15/046* (2013.01)

(58) Field of Classification Search
CPC ...... G11C 11/54; G11C 15/046; G06N 3/063; G06N 3/08
USPC .......................................................... 706/33
See application file for complete search history.

(56) References Cited

U.S. PATENT DOCUMENTS

| | | | |
|---|---|---|---|
| 5,576,985 A | 11/1996 | Holtz | |
| 5,893,929 A | 4/1999 | Shadan et al. | |
| 6,023,466 A * | 2/2000 | Luijten | ............... H04L 49/3081 |
| | | | 707/E17.037 |
| 6,078,987 A | 6/2000 | Kongetira | |
| 6,317,349 B1 | 11/2001 | Wong | |
| 7,031,177 B2 | 4/2006 | De Sandre | |
| 7,133,302 B1 * | 11/2006 | Srinivasan | ............. G11C 15/04 |
| | | | 365/49.1 |
| 7,319,608 B2 | 1/2008 | Hsu et al. | |
| 8,559,232 B2 | 10/2013 | Lee | |
| 9,502,113 B2 | 11/2016 | Wang | |
| 9,754,668 B1 | 9/2017 | Wang | |
| 2013/0166850 A1 * | 6/2013 | Grover | ................ G06F 12/0607 |
| | | | 711/E12.001 |
| 2013/0338998 A1 * | 12/2013 | Freitas | ............... G11C 13/0004 |
| | | | 704/9 |
| 2017/0256296 A1 * | 9/2017 | Wang | ................... G06F 12/1036 |
| 2019/0311255 A1 * | 10/2019 | Wang | ................... G06F 12/0646 |
| 2020/0264790 A1 * | 8/2020 | Chang | ..................... G06N 3/063 |

(Continued)

OTHER PUBLICATIONS

U.S. Appl. No. 16/698,125, filed Nov. 27, 2019.

*Primary Examiner* — Ly D Pham
(74) *Attorney, Agent, or Firm* — Muncy, Geissler, Olds & Lowe, P.C.

(57) ABSTRACT

An in-memory digital processor, Perpetual Digital Perceptron (PDP), is disclosed. The digital in-memory processor of the invention processes the input digital information according to a database of the digital content data stored/hardwired in the Content Read Only Memory (CROM) array and outputs the correspondent digital response data stored/hardwired in the Response Read Only Memory (RROM) array. The PDP is the hardwired digital in-memory processor without re-configuration capability and similar to the instinct functions of biological hardwired brains without re-shaping their neuromorphic structures from training and learning.

17 Claims, 9 Drawing Sheets

(56) References Cited

U.S. PATENT DOCUMENTS

2020/0342940 A1\* 10/2020 Roy ..................... G11C 16/24
2021/0050060 A1\* 2/2021 Li ...................... G11C 11/4087
2021/0158870 A1\* 5/2021 Wang ................... G06N 3/063

\* cited by examiner

PERPECTUAL DIGITAL PERCEPTRON

BACKGROUND OF THE INVENTION

Field of the invention

The invention is related to a new digital in-memory processor without multiple computations. That is, the digital in-memory processor processes input digital information according to a database of the digital content data stored in the content memory and output the response digital data stored in the response memory accordingly. In particular, due to the simplicity of hardwired memory storage, the Read Only Memory (ROM) types of memory arrays are applied for the content memory and the response memory in the digital in-memory processor for reducing the silicon cost in Integrated Circuit (IC) manufacturing.

Description of the Related Art

Figure 1:
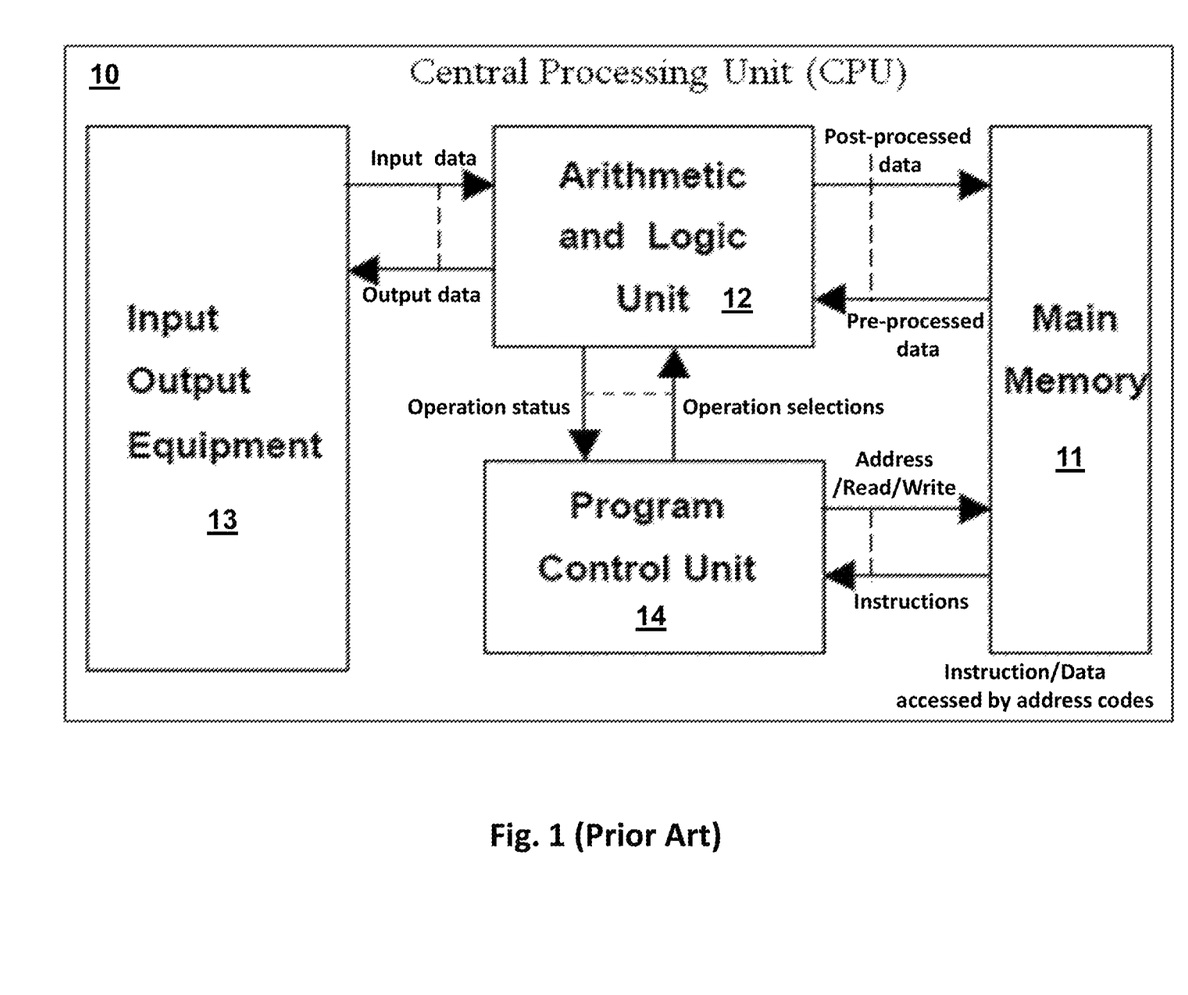
FIG. 1 shows the conventional Von-Neumann computing architecture for a typical Central Processing Unit (CPU).

In the modern Von Neumann computing architecture as shown in FIG. 1, the Central Process Unit (CPU) 10 executes logic operations according to the instructions and data from the main memory. The CPU 10 includes a main memory 11, an arithmetic and logic unit 12, an input/output equipment 13 and a program control unit 14. Prior to the computation process, the CPU 10 is set by the program control unit 12 to point to the initial address codes for the initial instruction in the main memory. The digital data are then processed with the arithmetic and logic unit 12 according to the sequential instructions in the main memory 11 accessed by the clock-synchronized address pointer in the program control unit 12. In general, the digital logic computation process for CPU 10 is synchronously executed and driven by a set of pre-written sequential instructions stored in the memory.

The power consumption for digital computations is given by $P \sim f^* C^* V_{DD}^2$, where f is the clock frequency, C is the total active circuit capacitance and $V_{DD}$ is the positive voltage supply for digital circuitries. Accordingly, the energy requirement for running a computation sequence is proportional to the numbers of clock steps to complete the set of instructions. Each instruction step includes fetching the instruction and data from memory, executing the micro-operations in arithmetic and logic unit, and storing the resultant data back to the memory or outputting to the I/O (Input/Output) unit. The total computation energy for completing a set of instructions is proportional to the frequency of memory accessing and the charging/discharging the total capacitances of the bus-lines and the active digital circuitries (registers, logic gates, and multiplexers). The more frequent memory accessing to complete the computation processing steps, the more energy and processing time are consumed for the digital processors.

While for a biologic nerve system the external stimuli such as lights, sounds, touches, tastes, and smells, are received by the fields of sensory organs connected to the nerve system. The neural signals in the forms of electrical pulses and neural transmitters (molecules) generated in the receptor fields are propagated to trigger the activation of next connecting layer of the neural network in the nerve system. The field of neural signals generated from the connecting layer continues to process forward throughout the multiple layers of the neural network hardware in the nerve system. Each neural network layer is parallel processing and extracting the information according to its neuromorphic structures and the receptive fields of neural signals from the previous layers. Unlike the present Von Neumann computing system iterating multiple logic computations for digital data by the pre-written instructions, the neural signals for information processing are propagated layer-to-layer in one-step feed-forward fashion by their neuromorphic structures. Therefore, in terms of information processing efficiencies and energy consumptions, the parallel processing and extracting information for layers of neural network in biologic nerve systems are superior to the processing and extracting information by multiple sequential logic computations in the present computing systems.

Inspired by the neural network information parallel processing, we are motivated to invent a digital in-memory processor analogy to the information processing in neural network systems directly by the processor's memory hardware for parallel processing digital signals within one feed-forward step. A digital symbol for digital information processing is generally represented by a string of bits in the combination of "0 s" and "1 s", where the signals of "1" and "0" are provided by the applying positive voltage $V_{DD}$ and the ground voltage $V_{SS}$ in digital circuitries respectively. An input digital symbol with multiple bits representing specific input content information can be intelligently processed to output another digital symbol representing the perceived/response information by the memory processor. The processor is given by the name of "Digital Perceptron". The meaning of "intelligently processed" is that the perceptive/response information is autonomously processed with the input digital "content" symbol according to a pool of known knowledge of digital "content" symbols. In contrast to the "content" processing, CPU processes digital information with logic operations and memory by pointing to the address locations. While the logic contents of look-up-tables in FPGA (Field Programmable Gate Array) are extracted for digital information processing by configuring their address multiplexers through connections.

The digital perceptron can be configured to store a group of digital content symbols and their correspondent digital output symbols in the memory units similar to the built-in neural network hardware. The group of digital symbols can represent various scenarios in real world as the digital contents. The correspondent digital output symbols could be digital commands to drive an analog device or the input digital symbols for other digital perceptrons. In the previous invention disclosed in U.S. Pat. No. 9,754,668 B1 (the disclosure of which is incorporated herein by reference in its entirety), we apply configurable non-volatile memory arrays in the digital perceptron for storing digital content symbols and digital response symbols.

Since the content memory and the response memory in the "Digital Perceptron" for the applications such as arithmetic operations, fixed parameters and constant functions are perpetual, we can apply the hardwired ROM memory arrays to save the silicon area cost owing to the simplicity of ROM memory cell arrays and no circuitry requirement for memory's write/clear functions in IC manufacturing. We will call this type of "Digital Perceptron" as the "Perpetual Digital Perceptron (PDP)". The PDP is the hardwired digital in-memory processors without the re-configuration capability and similar to the instinct functions of biological hardwired brains without re-shaping (reconfiguring) their neuromorphic structures from training and learning.

SUMMARY OF THE INVENTION

Figure 2:
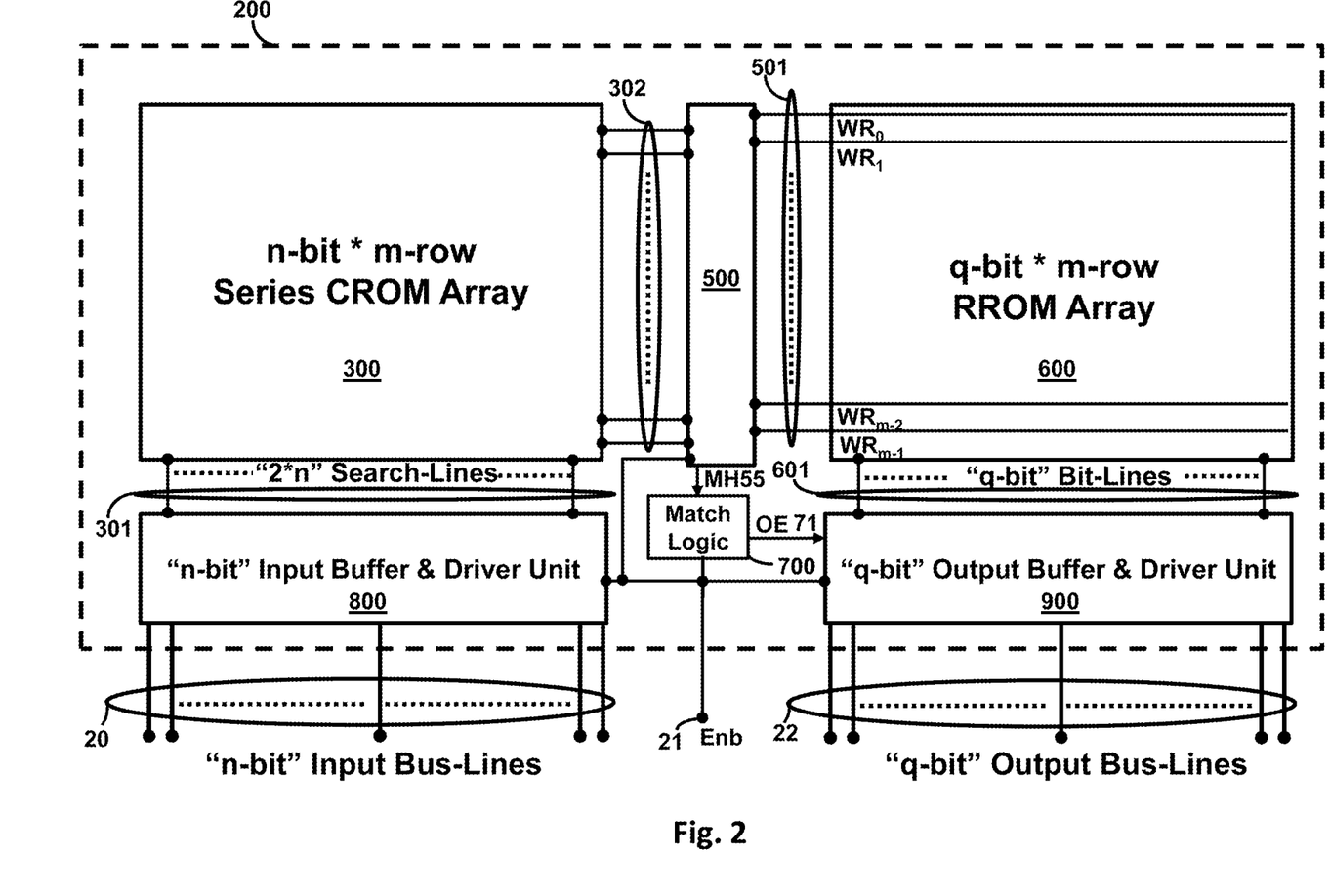
FIG. 2 shows the block diagram of the "Perpetual Digital Perceptron (PDP)" according to the invention.

To fulfill the above described functions of "Perpetual Digital Perceptron (PDP)", we have constructed the PDP 200 in FIG. 2 with an n-bit by m-row series Content Read Only Memory (CROM) array 300, a q-bit by m-row Response Read Only Memory (RROM) array 600, an "n-bit" Input Buffer and Driver Unit 800 for inputting n-bit digital information, an Match Detector Unit 500 for the selection of "m" wordlines in RROM array 600, and a "q-bit" Output Buffer and Driver Unit 900 for outputting the "q-bit" digital information from the RROM array 600. The PDP 200 is connected to the "n-bit" Input Bus-Lines 20 for receiving the inputted digital data signals and the "q-bit" Output Bus-Lines 22 for sending out the output digital data signals. The "Enb" signal with a high voltage $V_{DD}$ at node 21 is applied to activate the in-memory processor PDP 200.

When the PDP 200 is activated by the "Enb" signal with the high voltage $V_{DD}$, the "n-bit" Input Buffer and Driver Unit 800 sends out the voltage signals of the inputted digital data string to the n-bit by m-row CROM array 300 to search a row of digital data string stored in the CROM array 300 by the Search-Lines 301 for a match. If the inputted data string matches a row of digital data string stored in the CROM array 300, the matched voltage signal from the correspondent Match-Detector (in the Match Detector Unit 500) attached to the correspondent Match-Line in the CROM array 300 is generated to select the correspondent wordline $WR_j$ among the "m" wordlines 501 in the n-bit by m-row RROM array 600. The voltage signals of the "q-bit" response code stored in the correspondent row of the RROM array 600 by the selected wordline are sent to the "q-bit" Output Buffer and Driver Unit 900 by the "q-bit" Bit-Lines 601.

To eliminate the false response for the irrelevant content inputs, the "q-bit" Output Buffer and Driver Unit 900 is connected to the external "q-bit" Output Bus-Lines 22, if and only if there is a match for the n-bit input data with a row of stored content data in CROM array 300. The match signal MH with a high voltage $V_{DD}$ at node 55 from the Match Detector Unit 500 for a match is sent to the Match Logic Unit 700 in FIG. 2. While the PDP 200 is activated by the "Enb" signal with a high voltage $V_{DD}$ at node 21 and then generates the match signal MH with a high voltage $V_{DD}$ for a match, the Match Logic Unit 700 will send out the "OE" signal with a high voltage $V_{DD}$ at node 71 to connect the "q-bit" Output Buffer and Driver Unit 900 with the external "q-bit" Output Bus-Lines 22.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiment of the present invention described herein in the context of methods and schematics are illustrative only and are not intended to be in any way limiting. Other embodiments of the present invention will readily suggest themselves to such skilled persons having the benefits of this disclosure.

Figure 3:
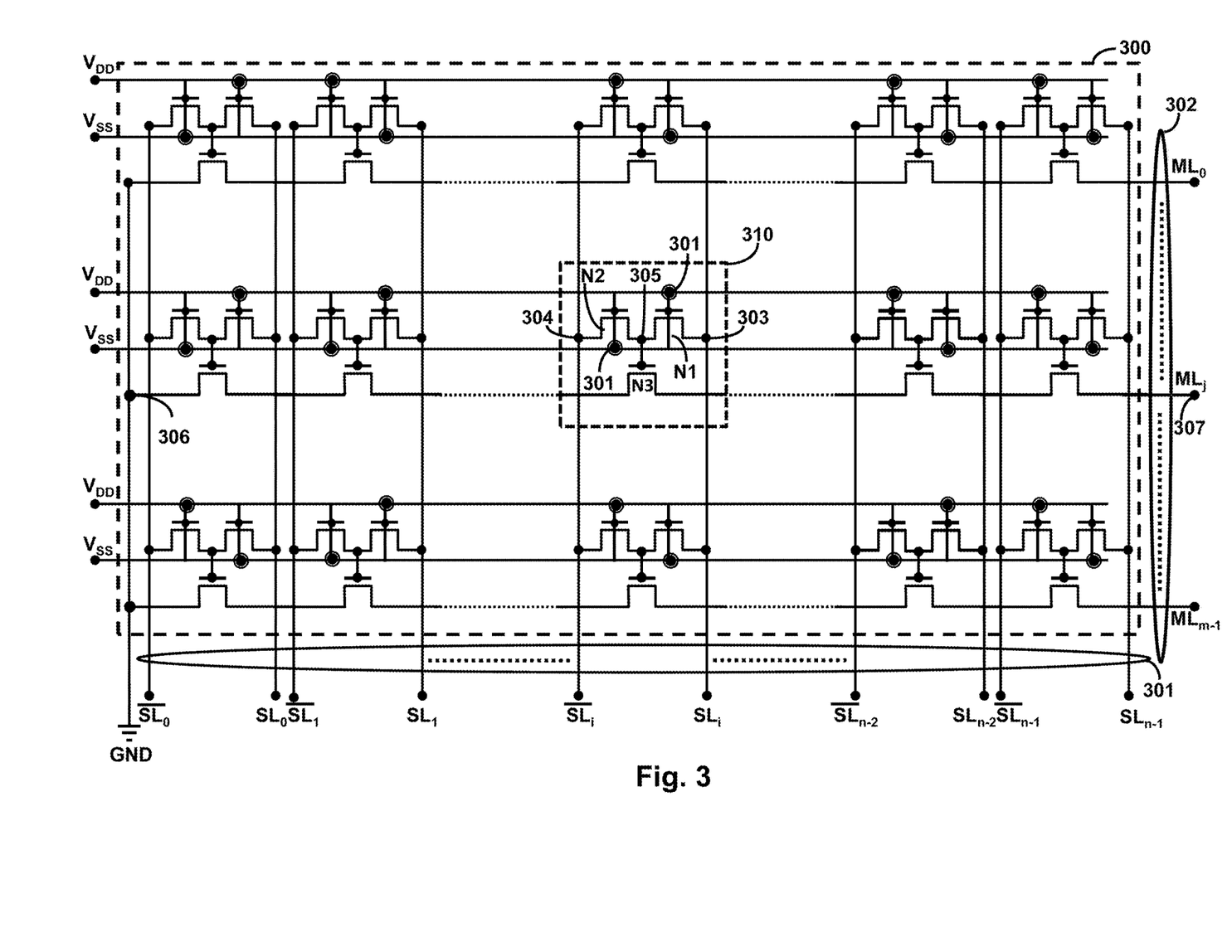
FIG. 3 shows the schematic of the n-bit*m-row series CROM array according to an embodiment of the invention.

FIG. 3 shows the schematic of the n-bit*m-row CROM array 300 according to an embodiment of the invention. Each CROM cell 310 consists of a complementary pair of NMOSFET (N-type Metal Oxide Semiconductor Field Effect Transistor) devices N1 and N2, and a switching NMOSFET device N3. The two drain electrodes 303 and 304 of the complementary NMOSFET devices N1 and N2 in one column of CROM cells 310 are respectively connected to form the Search-Line $SL_i$ and its complementary Search-Line $\overline{SL}_i$ in the vertical direction, for i=0, 1, ..., (n−1) columns. In each CROM cell 310, the common electrode 305 of the complementary NMOSFET devices N1 and N2 is connected to the gate of the switching NMOSFET device N3. Each row of the switching NMOSFET devices N3 is connected in series to form a horizontal Match-Line $ML_j$, for j=0, 1, ..., (m−1) rows, in the CROM array 300. The left-hand end nodes 306 of all the rows of Match-Lines $ML_j$ are connected altogether to the ground voltage $V_{SS}$, while the right-hand end nodes 307 of each Match-Lines $ML_j$ are respectively connected to correspondent Match-Detectors j, for j=0, 1, ..., (m−1), in the Match Detector Unit 500 (see FIG. 5 in detail) through Match-Lines 302 shown in FIG. 2.

The digital voltage supply lines $V_{DD}$ and $V_{SS}$ run horizontally for each row of CROM cells 310 for the convenience of connection to the gates of the complementary NMOSFET devices N1 and N2 in the CROM cells 310. The gates of the complementary pair of NMOSFET device N1 and N2 in each cell 310 are respectively connected to the voltage supply lines ($V_{DD}$ and $V_{SS}$) by two metal contacts 301 (up right and down left) for storing datum "1", and to the voltage supply lines ($V_{DD}$ and $V_{SS}$) by two metal contacts 301 (down right and up left) for storing datum "0", as illustrated in the CROM cells 310 in the CROM array 300 in FIG. 3. A number m of n-bit content data are stored/hardwired in the m rows of CROM cells 310 of CROM array 300.

Figure 4A:
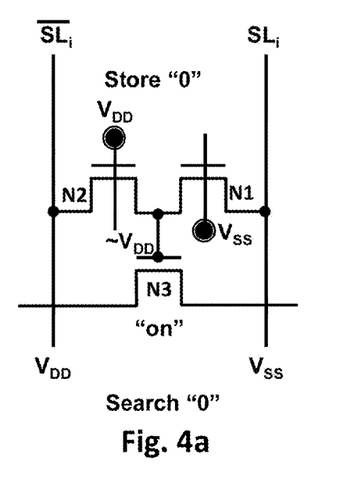
FIGS. 4a~4d show four situations of bit-search-match for the CROM cell in FIG. 3 according to an embodiment of the invention.
Figure 4B:
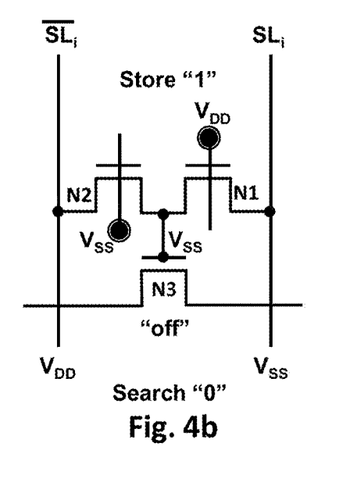
Figure 4C:
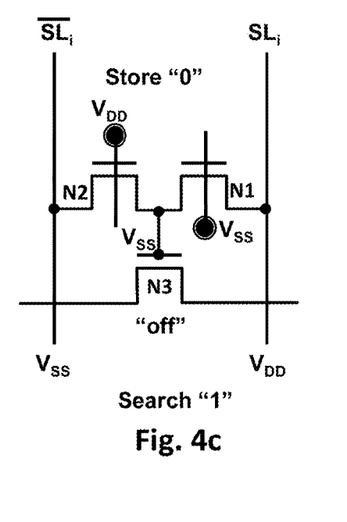
Figure 4D:
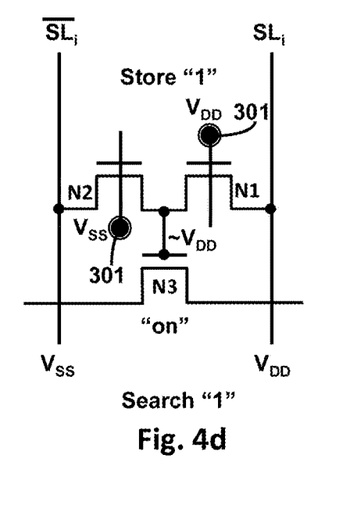

FIGS. 4a~4d show four situations of bit-search-match for the CROM cell in FIG. 3 according to an embodiment of the invention. Specifically, FIG. 4a shows a situation of (search "0" and store "0"), indicating that data match and the switching NMOSFET device N3 is turned "on"; FIG. 4b shows a situation of (search "0" and store "1"), indicating that data do not match and the switching NMOSFET device N3 is turned "off"; FIG. 4c shows a situation of (search "1" and store "0"), indicating that data do no match and the switching NMOSFET device is turned "off"; FIG. 4d shows a situation of (search "1" and store "1"), indicating that data match and the switching NMOSFET device N3 is turned "on".

The voltage signals ($V_{DD}$ and $V_{SS}$) and ($V_{SS}$ and $V_{DD}$) are respectively applied to the Search-Line $SL_i$ and its complementary Search-Line $\overline{SL}_i$ for the inputted search datum "1" and the inputted search datum "0". When the voltage signals of n-bit inputted data from the "n-bit" Input Buffer and Driver Unit 800 are applied to the "2*n" Search-Lines 301 to search a row of the stored digital data for obtaining a row-match, the "n" switching NMOSFET devices N3 of the matched row of CROM cells 310 will be all turned on to connect the entire matched Match-Line to the ground voltage potential at the left-hand end node 306. Since any of "turned-off" NMOSFET devices N3 in the un-matched CROM cells 301 would break the electrical connection between the right-hand end nodes 307 of the Match-Lines and the common ground voltage potential at the left-hand end node 306, the voltage potentials at the right-hand end nodes 307 of the un-matched Match-Lines remain floating. The right-hand end nodes 307 of the Match-Lines 302 are further connected to the correspondent Match-Detectors 51 in the Match Detector Unit 500 in FIG. 5. The voltage potentials (ground and floating) at the right-hand end nodes 307 of the Match-Lines 302 are applied to trigger the match-status data in the Match-Detectors 51.

Figure 5:
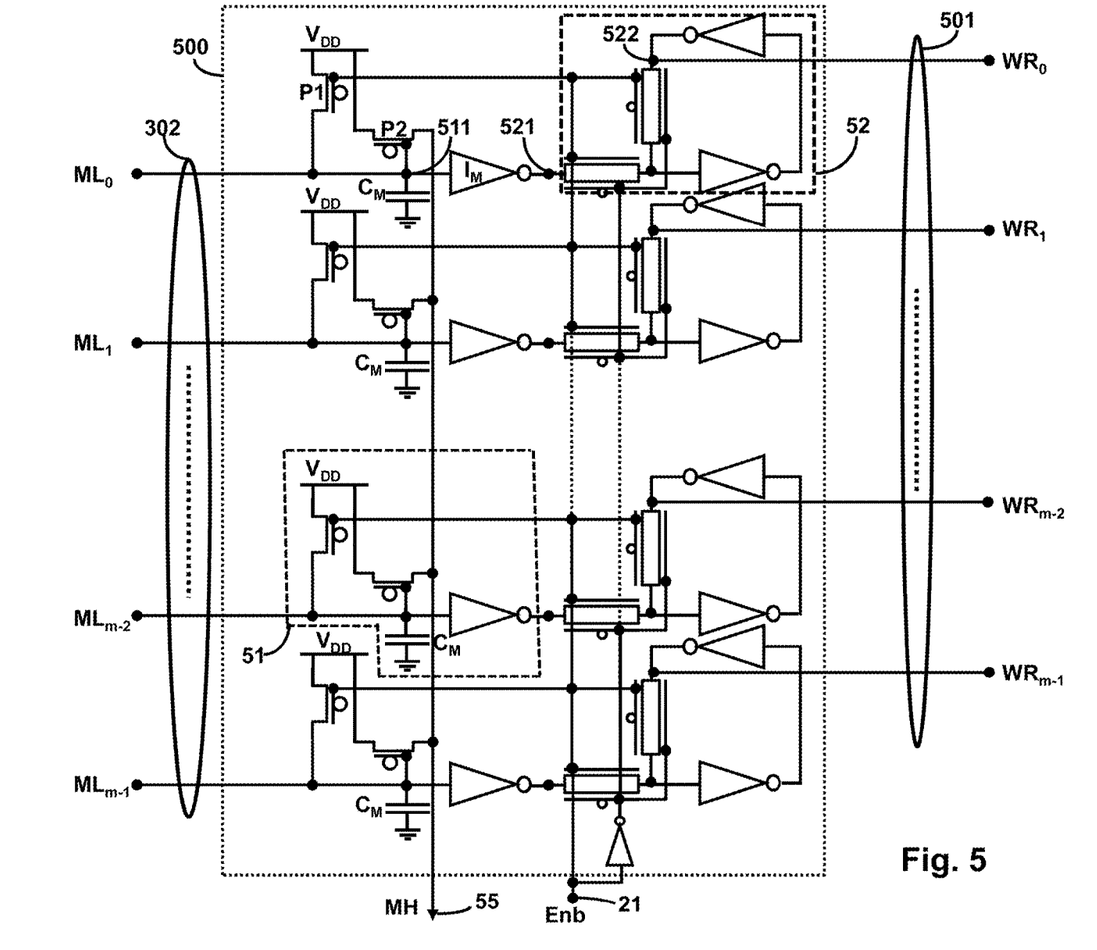
FIG. 5 shows the schematic of the Match Detector Unit according to an embodiment of the invention.

In FIG. 5, the Match Detector Unit 500 consists of a number m of Match-Detectors 51 for sensing the voltage potentials at nodes 511 connected to the Match-Lines 302 and a number m of flip-flops 52 for storing the matching status data of the Match-Lines 302. Each Match-Detector 51 consists of a high voltage supply PMOSFET device P1, a matching PMOSFET device P2, an inverter $I_M$, and a charging capacitor $C_M$. When one Match-Detector 51 is activated by the "Enb" signal with a high voltage $V_{DD}$ at node 21, the high voltage supply PMOSFET device P1 is turned off to disconnect its corresponding Match-Line along with the capacitor node 511 from the high voltage rail $V_{DD}$. Since the matched Match-Line attached with the correspondent Match-Detector discharges to the ground voltage potential, the voltage potential at node 511 will drop below the threshold voltage of the inverter $I_M$ to flip to the high voltage "$V_{DD}$" at the output node 521. While the voltage potentials at nodes 521 of the other inverters $I_M$ remain at the ground voltage $V_{SS}$ due to the remaining "high" voltage potentials at the gates above the inverters' flipping threshold voltage at the nodes 511 accordingly with the effect of charge sharing between the "$V_{DD}$" voltage capacitor nodes 511 and the floating right-hand end nodes 307 of the un-matched Match-Lines 302. The output voltage signals of the inverters $I_M$ are then stored in the match-status flip-flops 52. Meanwhile the voltage potential at node 55 will be charged by one of the MOSFET devices P2 attached with the high voltage supply $V_{DD}$ for any one of the row-matched situation.

The high voltage signal $V_{DD}$ at the output node 522 of the matched match-status flip-flop for the correspondent Match-Detector 51 is then applied to activate the correspondent wordline in the q-bit*m-row RROM array 600 to output the voltage signals of the response q-bit code stored/hardwired in the corresponding row of the RROM 600. On the other hand, the low voltage signals $V_{SS}$ at the output nodes 522 of the un-matched match-status flip-flops 52 deactivate the un-matched wordlines in the q-bit by m-row RROM array 600.

Figure 6:
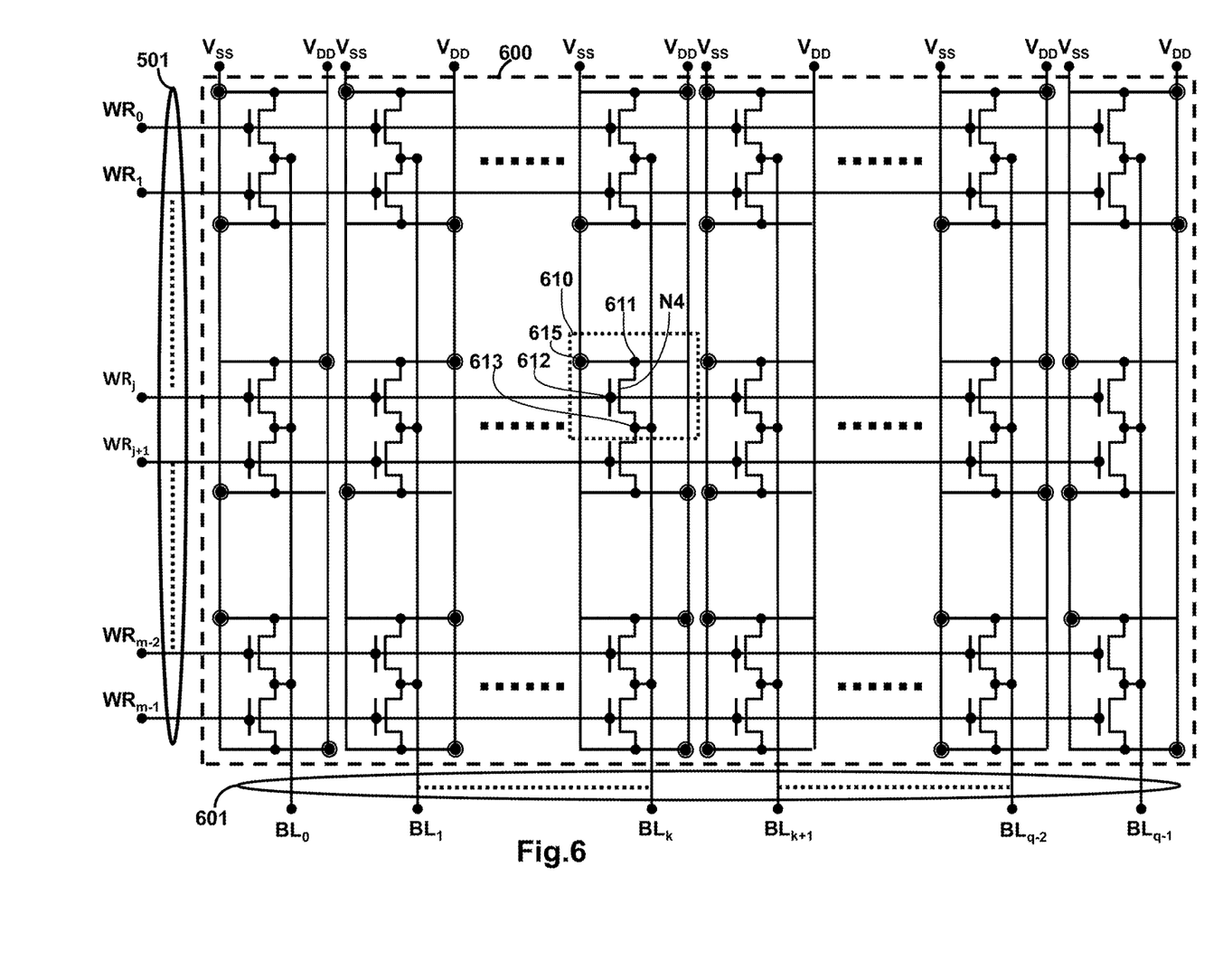
FIG. 6 shows the schematic of the q-bit*m-row RROM array according to an embodiment of the invention.

FIG. 6 shows the schematic of the q-bit * m-row RROM array according to an embodiment of the invention. Each RROM cell 610 consists of an NMOSFET device N4. The gates 612 of the $j^{th}$ row of NMOSFET devices N4 are connected to form the wordline $WR_j$, for j=0, 1, . . . , (m−1). The digital voltage supply lines $V_{DD}$ and $V_{SS}$ run vertically for conveniently connecting the source electrodes 611 of the NMOSFET device N4 for each column of RROM cells 610. The drain electrodes 613 of the NMOSFET devices N4 for the $k^{th}$ column are connected to form the bitline $B_k$, for k=0, 1, 2, . . . , (q−1). The source electrode 611 of the NMOSFET device N4 for each RROM cell 610 is connected to either the vertical "$V_{DD}$" line for storing digital datum "1" or the vertical "$V_{SS}$" line for storing digital datum "0", by a metal contact 615. A number "m" of q-bit response data are stored/hardwired in the m rows of RROM cells 610 of RROM array 600. The correspondent wordline $WR_j$ is activated by the "high" voltage signal $V_{DD}$ from the correspondent Match-Detector for the inputted n-bit digital data string matched with the row of stored digital data string in the CROM array 300. The NMOSFET devices N4 of the activated wordline $WR_j$ for the correspondent row are then turned on to pass the voltage signals of their stored digital data onto the "q-bit" Bit-Lines 601 in FIG. 6. The voltage signals on the q-bit Bit-Lines 601 for the correspondent row in the RROM array 600 are then readout by "q-bit" Output Buffer and Driver Unit 900 as shown in FIG. 2.

Figure 7:
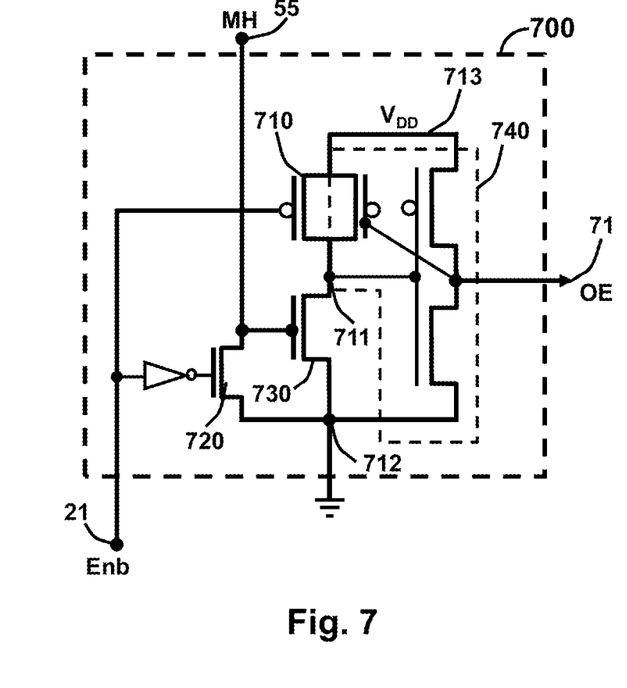
FIG. 7 shows the schematic of the Match Logic Unit for the PDP according to an embodiment of the invention.

FIG. 7 shows the schematic of Match Logic Unit 700. When the "Enb" signal at node 21 is not activated with $V_{SS}$ (i.e., node 21 having the ground voltage), the PMOSFET 710 and the NMOSFET 720 are both "on" to have the voltage potential $V_{DD}$ at node 711 such that the voltage potential at the node 71 of the half latch 740 is $V_{SS}$. When the node 21 is activated by the Enb signal with a high voltage $V_{DD}$ to turn off both PMOSFET 710 and NMOSFET 720, the NMOSEFT 730 is then "on", only with the MH signal having a high voltage $V_{DD}$ at the node 55, to pull down the voltage potential at node 711 to the ground potential such that the voltage potential at the output node 71 of the half latch 740 is the high voltage signal $V_{DD}$. Therefore, the $V_{DD}$ voltage signal at the node 71 of the half latch 740 is then applied to connect the "q-bit" Output Buffer and Driver Unit 900 to the "q-bit" Output Bus-Lines 22 only for the match signal MH having a high voltage $V_{DD}$ at the node 55 in FIG. 2. In other word, if the n-bit input data match any one row of n-bit content data in CROM array 300, the match signal MH with a high voltage $V_{DD}$ from one of the Match-Detector enables the Match Logic Unit 700 to output an OE signal with a high voltage $V_{DD}$ at the node 71 to the "q-bit" Output Buffer and Driver Unit 900 for connecting the "q-bit" Output Buffer and Driver Unit 900 to the "q-bit" Output Bus-Lines 22. Otherwise, the "q-bit" Output Buffer and Driver Unit 900 is not connected to the "q-bit" Output Bus-Lines 22 for the "no-match" content memory situation to prevent "q-bit" Output Bus-Lines 22 occupied for the irrelevant processing events.

Figure 8:
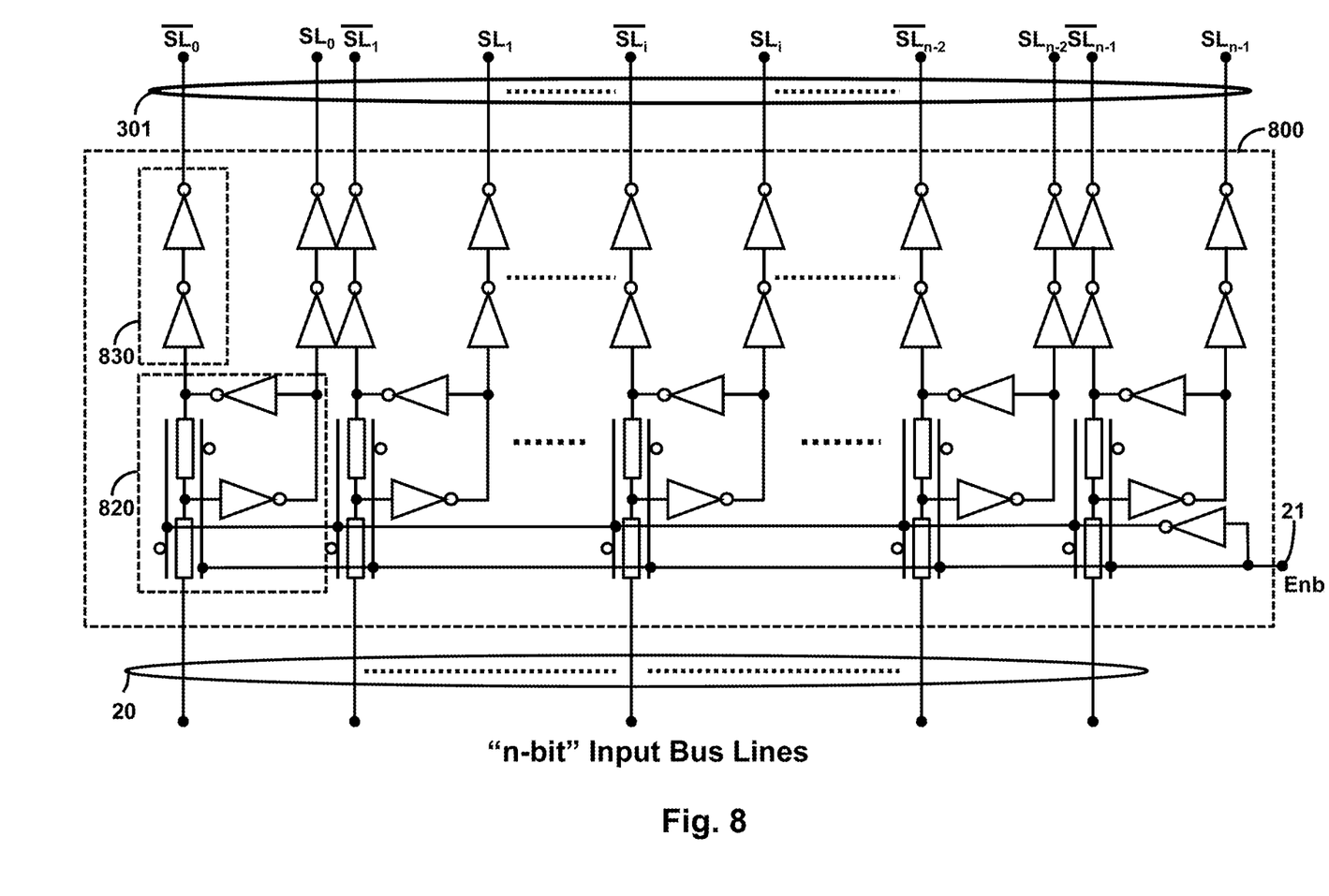
FIG. 8 shows the schematic of the "n-bit" Input Buffer and Driver Unit for the PDP according to an embodiment of the invention.

FIG. 8 shows the schematic of the Input Buffer and Driver Unit 800 consisting of a number "n" of data flip-flips 820 for storing the n-bit inputted data and a number "2*n" of two-stage inverter driver 830 for driving the voltage signals onto the Search-Lines 301. When the PDP 200 is enabled by the "Enb" signal with a high voltage $V_{DD}$, the number "n" of data flip-flops 820 receive the n-bit data voltage signals from the "n-bit" Input Bus-Lines 20. The "2*n" two-stage inverter drivers 830 then drive the applied voltage signals onto the Search-Lines $SL_i$ and complementary Search-Lines $\overline{SL}_i$, for i=0, . . . , (n−1), in the CROM array 300.

Figure 9:
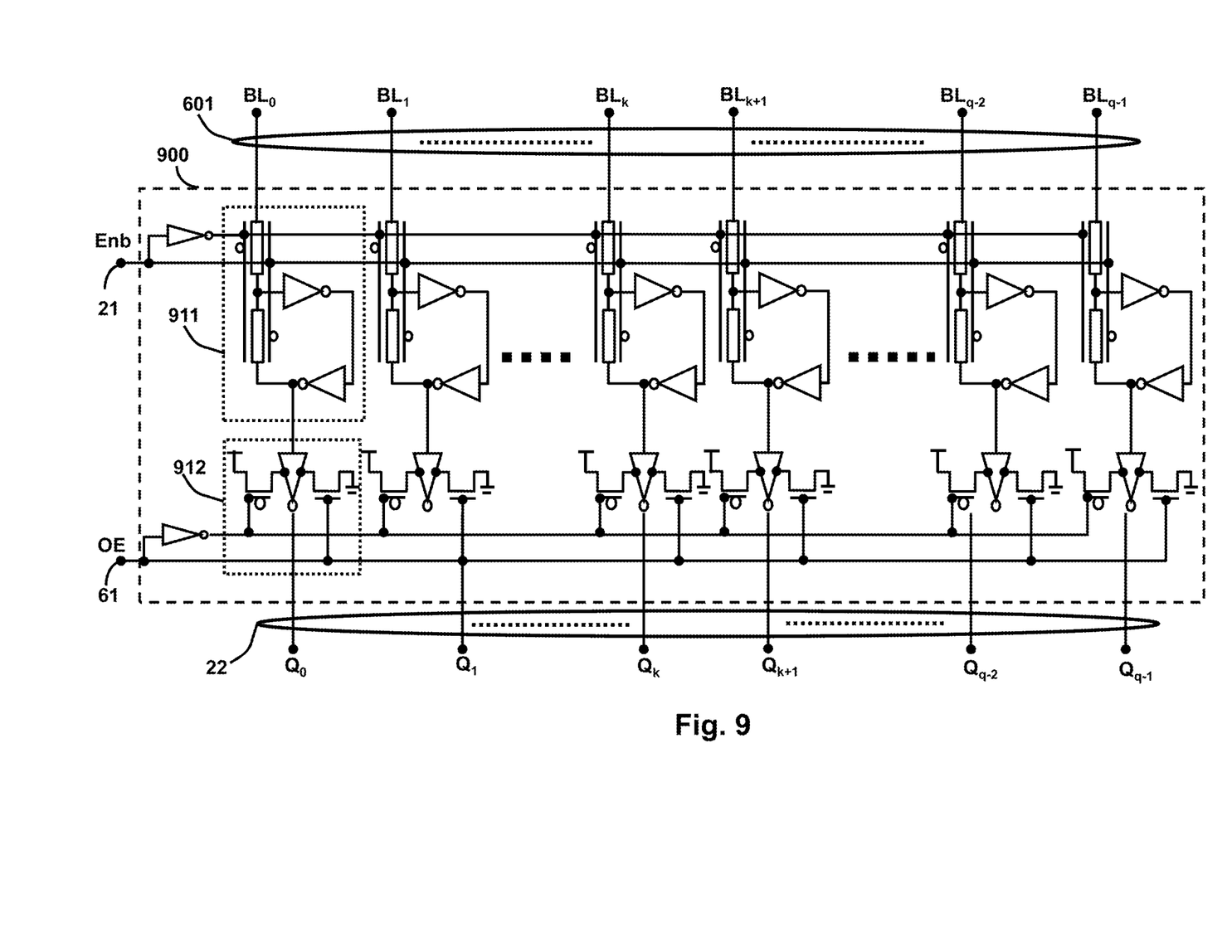
FIG. 9 shows the schematic of the "q-bit" Output Buffer and Driver Unit for the PDP according to an embodiment of the invention.

The "q-bit" Output Buffer and Driver Unit 900 includes a number q of output data flip-flops 911 for storing the "q-bit" voltage signals from the "q-bit" Bit-Lines 601 and a number q of drivers 912 for driving the "q-bit" voltage signals onto the Output Bus-Lines 22. When one of the wordlines 501 in the RROM array 600 is turned on by the Match Detector Unit 500, the "q-bit" voltage signals at the "q-bit" Bit-Lines 601 for the correspondent row in the RROM array 600 are sent to the number "q" of output data flip-flops 911 shown in FIG. 9 if the "Enb" signal at node 21 has a high voltage $V_{DD}$. The "OE" signal with a high voltage $V_{DD}$ at node 71 from the Match Logic Unit 700 enables the connection between the number "q" of drivers 912 to the Output Bus-Lines 22. The "q-bit" output voltage signals $Q_k$, for k=0, 1, . . . ,(q−1), of the response data in the PDP 200 are then passed to the "q-bit" Output Bus-Lines 22 for the inputs of other nodes of processor units.

The aforementioned description of the preferred embodiments of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital perceptron device, comprising:
    a first read-only-memory (ROM) array comprising m rows by n columns of first memory cells for parallel comparing a n-bit input symbol with a number m of n-bit content symbols hardwired in the m rows of first memory cells, wherein each row of the first memory cells generates an indication signal indicative of whether the n-bit input symbol matches its hardwired n-bit content symbol;
    a detection circuit for respectively applying a number m of switching signals to a number m of wordlines of a second ROM array in response to a number m of indication signals; and
    the second ROM array comprising m rows by q columns of second memory cells, wherein a number m of q-bit response symbols are respectively hardwired in the m rows of second memory cells;
    wherein while receiving an activated switching signal, a row of second memory cells is switched on to output its hardwired q-bit response symbol as a q-bit output symbol; and
    wherein the q-bit output symbol is autonomously processed with the n-bit input symbol according to the number m of n-bit content symbols and the number m of q-bit response symbols.

2. The digital perceptron device according to claim 1, wherein if all the switching signals are de-activated, the second ROM array outputs no q-bit response symbols.

3. The digital perceptron device according to claim 1, wherein the detection circuit activates a match signal and zero or one of the number m of switching signals in response to a first control signal and the number m of indication signals, wherein the first control signal is activated when the digital perceptron device is activated, and wherein the match signal is activated when the n-bit input symbol matches one of the number m of n-bit content symbols and the first control signal is activated.

4. The digital perceptron device according to claim 3, wherein the detection circuit comprises a number m of sensing cells, each comprising:
    a match-detector for receiving the first control signal and a corresponding indication signal to generate a sensing signal; and
    a flip-flop unit for storing the sensing signal and activating a corresponding switching signal in response to the first control signal and the sensing signal.

5. The digital perceptron device according to claim 4, wherein each match-detector comprises:
    a first PMOS device connected between a digital voltage rail having a digital voltage and a first connection node receiving the corresponding indication signal, a gate of the first PMOS device receiving the first control signal;
    a second PMOS device connected between the digital voltage rail and a second connection node, a gate of the second PMOS device being connected to the first connection node;
    an inverter connected between the first connection node and the flip-flop unit for inverting the corresponding indication signal into the sensing signal; and
    a capacitor connected between the first connection node and a ground node;
    wherein the second connection nodes for all the match-detectors are connected together to generate the match signal.

6. The digital perceptron device according to claim 3, further comprising:
    an input buffer and driver unit connected between a number n of complementary search-line pairs of the first ROM array and an input bus for temporarily storing and driving the n-bit input symbol to the number n of complementary search-line pairs according to the first control signal;
    wherein the input bus is used to receive the n-bit input symbol.

7. The digital perceptron device according to claim 3, further comprising:
    an output buffer and driver unit located between a number q of bitlines of the second ROM array and an output bus for temporarily storing the q-bit output symbol and driving the q-bit output symbol to the output bus, wherein whether the output buffer and driver unit is electrically connected to the number q of bitlines of the second ROM array depends on the first control signal, wherein whether the output buffer and driver unit is electrically connected to the output bus depends on the match signal, and wherein the output bus is used to send out the q-bit output symbol.

8. The digital perceptron device according to claim 1, wherein the first ROM array further comprises:
a number m of match-lines, each generating a corresponding indication signal and being formed by series-connected switching transistors of the first memory cells in a row;
a number n of complementary search-line pairs for receiving the n-bit input symbol, each complementary search-line pair being connected to the first memory cells in a column;
a number m of first voltage rail pairs extending along the number m of match-lines, wherein one rail of each first voltage rail pair is a digital voltage rail and the other rail of each first voltage rail pair is a ground voltage rail; and
a common source line for connecting the same-side terminals of the match-lines altogether to a predetermined voltage terminal.

9. The digital perceptron device according to claim 8, wherein each first memory cell comprises:
a first NMOS device, a gate of which is connected to one rail of a corresponding first voltage rail pair;
a second NMOM device, a gate of which is connected to the other rail of the corresponding first voltage rail pair; and
the switching transistor, wherein first terminals of the first NMOS device and the second NMOS device are connected together to a gate electrode of the switching transistor, a second terminal of the first NMOS device being connected to one of a corresponding complementary search-line pair, a second terminal of the second NMOS device being connected to the other one of the corresponding complementary search-line pair.

10. The digital perceptron device according to claim 1, wherein the second ROM array further comprises:
a number q of bitlines for outputting the q-bit output symbol, each bitline being connected to the second memory cells in a column;
a number q of second voltage rail pairs extending along the number q of bitlines, wherein one rail of each second voltage rail pair is a digital voltage rail and the other rail of each second voltage rail pair is a ground voltage rail; and
the number m of wordlines, each being connected to gates of the second memory cells in a row.

11. The digital perceptron device according to claim 10, wherein each second memory cell is a MOS device, and wherein a gate of the MOS device is connected to a corresponding wordline, a first terminal of the MOS device is connected to a corresponding bitline and a second terminal of the MOS device is connected to one of the digital voltage rail and the ground voltage rail of a corresponding second voltage rail pair.

12. A method for operating a digital perceptron device comprising a first read-only-memory (ROM) array and a second ROM array, the method comprising:
parallel comparing an n-bit input symbol with a number m of n-bit content symbols hardwired in the first ROM array comprising m rows by n columns of first memory cells so that each row of first memory cells generates an indication signal indicative of whether the n-bit input symbol matches its hardwired n-bit content symbol;
respectively applying a number m of switching signals to a number m of wordlines in the second ROM array comprising m rows by q columns of second memory cells according to a number m of indication signals, wherein a number m of q-bit response symbols are hardwired in the m rows of second memory cells;
switching on a row of second memory cells to output its hardwired q-bit response symbol as a q-bit output symbol in response to a received activated switching signal; and
switching off a row of second memory cells in response to a received de-activated switching signal;
wherein the q-bit output symbol is autonomously processed with the n-bit input symbol according to the number m of n-bit content symbols and the number m of q-bit response symbols.

13. The method according to claim 12, further comprising:
if all the switching signals are de-activated, outputting no q-bit response symbol by the second ROM array.

14. The method according to claim 12, further comprising:
prior to the step of parallel comparing, activating a first control signal to activate the digital perceptron device.

15. The method according to claim 14, wherein the step of respectively applying comprises:
respectively generating a number m of sensing signals and activating a match signal based on the m indication signals and the first control signal;
respectively storing the number m of sensing signals based on the first control signal; and
activating zero or one of the number m of switching signals according to the number m of sensing signals;
wherein the match signal is activated when the n-bit input symbol matches one of the number m of n-bit content symbols and the first control signal is activated.

16. The method according to claim 15, further comprising:
after the step of switching on, temporarily storing the q-bit output symbol according to the first control signal; and
driving the q-bit output symbol to an output bus according to the match signal.

17. The method according to claim 14, further comprising:
prior to the step of parallel comparing, temporarily storing an n-bit input symbol; and
driving the n-bit input symbol to a number n of complementary search-line pairs in the first ROM array according to the first control signal.

* * * * *